United States Patent
Senoo et al.

(10) Patent No.: US 8,952,553 B2
(45) Date of Patent: Feb. 10, 2015

(54) SEMICONDUCTOR DEVICE WITH STRESS RELAXATION DURING WIRE-BONDING

(75) Inventors: Masaru Senoo, Toyota (JP); Tomohiko Sato, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/201,597

(22) PCT Filed: Feb. 16, 2009

(86) PCT No.: PCT/JP2009/052554
§ 371 (c)(1),
(2), (4) Date: Aug. 15, 2011

(87) PCT Pub. No.: WO2010/092691
PCT Pub. Date: Aug. 19, 2010

(65) Prior Publication Data
US 2011/0298048 A1    Dec. 8, 2011

(51) Int. Cl.
H01L 29/417    (2006.01)
H01L 29/732    (2006.01)
(Continued)

(52) U.S. Cl.
CPC ............ *H01L 29/7397* (2013.01); *H01L 24/03* (2013.01); *H01L 24/05* (2013.01);
(Continued)

(58) Field of Classification Search
CPC ... H01L 21/3205; H01L 21/88; H01L 21/336; H01L 21/28; H01L 21/168; H01L 21/768; H01L 23/522; H01L 29/417; H01L 29/139; H01L 29/78; H01L 19/78; H01L 21/76877; H01L 2924/13055; H01L 21/3065; H01L 2224/8385; H01L 24/05; H01L 24/45; H01L 29/7395; H01L 29/7397; H01R 13/2414
USPC .......... 257/335, 773, 750, E29.111, E29.139, 257/E29.256, 378, 584, 579, 578, 784, 257/E29.112, E29.114, E29.197, E29.198

IPC ................ H01L 21/3205, 21/88, 21/336, 21/28, H01L 21/168, 21/768, 23/522, 29/417, 29/139, H01L 29/78, 19/78
See application file for complete search history.

(56) References Cited

U.S. PATENT DOCUMENTS 4,624,864 A * 11/1986 Hartmann .................... 438/642
4,833,519 A * 5/1989 Kawano et al. ............... 257/752
(Continued)

FOREIGN PATENT DOCUMENTS

JP        61-287147 A     12/1986
JP        61287147 A  *  12/1986
(Continued)

OTHER PUBLICATIONS

International Search Report of PCT/JP2009/052554 mailed Apr. 28, 2009.
(Continued)

*Primary Examiner* — Yu Chen
(74) *Attorney, Agent, or Firm* — Kenyon & Kenyon LLP

(57) ABSTRACT

The present teaching provides a semiconductor device capable of relaxing stress transferred to a contact region during wire bonding and improving reliability of wire bonding. A semiconductor device comprises contact regions, an interlayer insulating film, an emitter electrode, and a stress relaxation portion. The contact regions are provided at a certain interval in areas exposing at a surface of a semiconductor substrate. The interlayer insulating film is provided on the surface of the semiconductor substrate between adjacent contact regions. The emitter electrode is provided on an upper side of the semiconductor substrate and electrically connected to each of the contact regions. The stress relaxation portion is provided on an upper surface of the emitter electrode in an area only above the contact regions. The stress relaxation portion is formed of a conductive material. A Young's modulus of the material of the stress relaxation portion is lower than a Young's modulus of the material of the emitter electrode.

9 Claims, 10 Drawing Sheets

(51) Int. Cl.
 *H01L 29/739* (2006.01)
 *H01L 23/00* (2006.01)
(52) U.S. Cl.
 CPC ...... *H01L29/41725* (2013.01); *H01L 29/7395* (2013.01); *H01L 23/562* (2013.01); *H01L 2224/05556* (2013.01); *H01L 2224/05558* (2013.01); *H01L 2224/05624* (2013.01); *H01L 2924/01004* (2013.01); *H01L 2924/01013* (2013.01); *H01L 2924/01015* (2013.01); *H01L 2924/01022* (2013.01); *H01L 2924/01028* (2013.01); *H01L 2924/01029* (2013.01); *H01L 2924/01074* (2013.01); *H01L 2924/01079* (2013.01); *H01L 2924/13055* (2013.01); *H01L 2924/01033* (2013.01); *H01L 2924/01047* (2013.01)
 USPC .... 257/784; 257/335; 257/579; 257/E29.114; 257/E29.198

(56) References Cited

U.S. PATENT DOCUMENTS

| | | | | |
|---|---|---|---|---|
| 4,960,732 A * | 10/1990 | Dixit et al. | ............... | 438/628 |
| 4,987,099 A * | 1/1991 | Flanner | ............... | 438/620 |
| 5,084,413 A * | 1/1992 | Fujita et al. | ............... | 438/675 |
| 5,266,521 A * | 11/1993 | Lee et al. | ............... | 438/642 |
| 5,472,912 A * | 12/1995 | Miller | ............... | 438/643 |
| 5,582,971 A * | 12/1996 | Chen et al. | ............... | 438/643 |
| 5,889,330 A * | 3/1999 | Nishimura et al. | ............... | 257/758 |
| 6,284,651 B1* | 9/2001 | Sharan et al. | ............... | 438/649 |
| 6,346,731 B1* | 2/2002 | Nakajima et al. | ............... | 257/381 |
| 6,433,430 B2* | 8/2002 | Sharan et al. | ............... | 257/751 |
| 2002/0142548 A1 | 10/2002 | Takaishi | | |
| 2005/0167748 A1 | 8/2005 | Onda et al. | | |
| 2008/0149940 A1* | 6/2008 | Shibata et al. | ............... | 257/76 |

FOREIGN PATENT DOCUMENTS

| | | | |
|---|---|---|---|
| JP | 8-125181 | A | 5/1996 |
| JP | 8-213453 | A | 8/1996 |
| JP | 9-097911 | A | 4/1997 |
| JP | 2000-012845 | A | 1/2000 |
| JP | 2001-250946 | A | 9/2001 |
| JP | 2002-158354 | A | 5/2002 |
| JP | 2003-101024 | A | 4/2003 |
| JP | 2005-136270 | A | 5/2005 |
| JP | 2006-073805 | A | 3/2006 |
| JP | 2008-028079 | A | 2/2008 |

OTHER PUBLICATIONS

International Preliminary Examination Report of PCT/2009/052554 mailed Mar. 11, 2010.

* cited by examiner

SEMICONDUCTOR DEVICE WITH STRESS RELAXATION DURING WIRE-BONDING

This is a 371 national phase application of PCT/JP2009/052554 filed 16 Feb. 2009, the contents of which are incorporated herein by reference.

TECHNICAL FIELD

The present invention relates to a semiconductor device.

BACKGROUND ART

Semiconductor devices in which external wiring is wire-bonded onto a surface electrode are known. With a semiconductor device of this type, stress is applied to the surface electrode when the external wiring is wire-bonded onto the surface electrode. The stress applied to the surface electrode is transferred to a contact region formed in an area exposing at a surface of a semiconductor substrate and may damage the contact region. Damage to the contact region inhibits carrier flow and causes device performance of the semiconductor device to deteriorate.

In a semiconductor device disclosed in Patent Document 1, an interlayer insulating film is provided on a surface of a semiconductor substrate between adjacent contact regions. A surface electrode that is in contact with the contact regions is formed on the surface of the semiconductor substrate. A nickel layer is formed on an entire surface of the surface electrode. External wiring is wire-bonded to a surface of the nickel layer. The surface electrode is formed of aluminum and is softer than the nickel layer. Therefore, when the external wiring is wire-bonded to the surface of the nickel layer, stress applied to the nickel layer during wire bonding is absorbed by the surface electrode and stress transferred to the contact regions is relaxed.

Patent Document 1: Japanese Patent Application Publication No. 2008-28079

SUMMARY OF INVENTION

Technical Problem

With the semiconductor device of this type, the region between adjacent contact regions of the semiconductor substrate may become insulated from the surface electrode. For example, an insulating film may be formed between the adjacent contact regions and the surface electrode and the like is formed via the insulating film. In such a case, due to an influence of thickness of the insulating film or a control electrode formed on the surface of the semiconductor substrate, a step may be formed on an uppermost surface of the semiconductor device. Specifically, a step that is higher at above the region between the adjacent contact regions and lower at above the contact region is formed. With the semiconductor device disclosed in Patent Document 1, a step may be formed on the surface of the nickel layer due to the influence of the thickness of the interlayer insulating film. Therefore, when the external wiring is wire-bonded to the surface of the nickel layer, the external wiring is wire-bonded only to the higher part of the step. Accordingly, a contacting area between the nickel layer and the external wiring may be reduced and the external wiring becomes more easily detached. As a result, reliability of the wire bonding declines.

The present invention has been made in consideration of the problems described above.

An object of the present invention is to provide a semiconductor device capable of relaxing stress transferred to a contact region during wire bonding and improving reliability of wire bonding.

Solution to Technical Problem

The present invention relates to a semiconductor device comprising contact regions, an insulating film, a surface electrode, and a stress relaxation portion. Contact regions are provided in plurality at a certain interval in areas exposing at a surface of a semiconductor substrate. The insulating film is provided on the surface of the semiconductor substrate between adjacent contact regions. The surface electrode is provided on an upper side of the semiconductor substrate and electrically connected to each of the contact regions. The stress relaxation portion is provided on at least one part of an upper surface, an inside and a lower surface of the surface electrode in an area above the contact regions and not covered with the insulating film. The stress relaxation portion is formed of a conductive material. A Young's modulus of the conductive material is lower than a Young's modulus of the surface electrode.

With this semiconductor device, since the stress relaxation portion is softer than the surface electrode, when an external wiring is wire-bonded, stress applied during wire bonding is relaxed by the stress relaxation portion. Since the stress transferred to the contact regions during the wire bonding is relaxed, damage to the contact regions during the wire bonding can be suppressed. In addition, due to the stress relaxation portion being provided above the contact regions, an influence of a thickness of the insulating film is cancelled according to a thickness of the stress relaxation portion. Specifically, since the stress relaxation portion is provided on a lower part of a step formed on an uppermost surface of the semiconductor device, a height of the step formed on the uppermost surface of the semiconductor device is reduced. Accordingly, a contacting area between the uppermost surface of the semiconductor device and the external wiring can be increased. As a result, reliability of the wire bonding can be improved.

The semiconductor device described above preferably comprises a conductive portion formed of a second conductive material and between the surface electrode and the stress relaxation portion. In this case, preferably, a Young's modulus of the second conductive material is lower than the Young's modulus of the surface electrode and higher than the Young's modulus of the conductive material. According to this configuration, by providing the conductive portion, the stress applied during wire bonding can be relaxed in stages by the stress relaxation portion and the conductive portion. Therefore, the stress applied during wire bonding can be relaxed in a more effective manner.

In the semiconductor device described above, preferably, one of the conductive material and the second conductive material is a conductive polymer. According to this configuration, by bringing the conductive polymer into contact with the surface electrode, corrosion of the surface electrode can be prevented.

Another aspect of the present invention relates to a semiconductor device comprising contact regions, a drift region, planar gate electrodes, a surface electrode, and a stress relaxation portion. Contact regions are formed in plurality at a certain interval in areas exposing at a surface of a semiconductor substrate. The drift region is formed in an area exposing at the surface of the semiconductor substrate between adjacent contact regions. The planar gate electrodes are provided on an upper side of the semiconductor substrate, opposing a part of the contact regions and opposing the drift region. The surface electrode is provided on the upper side of the semiconductor substrate and electrically connected to a part of the contact regions. The stress relaxation portion is provided on at least one part of an upper surface, an inside and a lower surface of the surface electrode in an area above regions between adjacent planar gate electrodes and in which the planar gate electrodes are not provided. The stress relaxation portion is formed of a conductive material. The Young's modulus of the conductive material is lower than the Young's modulus of the surface electrode.

Since the stress relaxation portion is softer than the surface electrode, when the external wiring is wire-bonded, the stress applied during the wire bonding is relaxed by the stress relaxation portion. Since the stress transferred to the contact regions during the wire bonding is relaxed, the damage to the contact regions during the wire bonding can be suppressed. In addition, due to the stress relaxation portion being provided above the region between adjacent planar gate electrodes, a height of the step formed on the uppermost surface of the semiconductor device can be reduced. Accordingly, when the external wiring is wire-bonded to the uppermost surface of the semiconductor device, the contacting area between the uppermost surface of the semiconductor device and the external wiring can be increased. As a result, the reliability of the wire bonding can be improved.

Advantageous Effects of Invention

With the semiconductor device according to the present invention, the stress applied to the contact regions during the wire bonding can be relaxed. In addition, the reliability of the wire bonding can be improved.

BEST MODE FOR CARRYING OUT THE INVENTION

Preferred aspects of the present invention described above will be listed.
1. A surface electrode is provided on an entire uppermost surface of a semiconductor device. In this case, by using a same material for the uppermost surface of the semiconductor device to be wire-bonded, favorable bonding performance can be achieved.
2. A conductive material is brought into contact with contact regions and provided consecutively between adjacent interlayer insulating films. In this case, by bringing the conductive material into contact with edges of interlayer insulating films where stress tends to concentrate, a stress relaxing effect can be enhanced.

EMBODIMENTS

Embodiments will now be described with reference to the drawings.

First Embodiment

Figure 1:
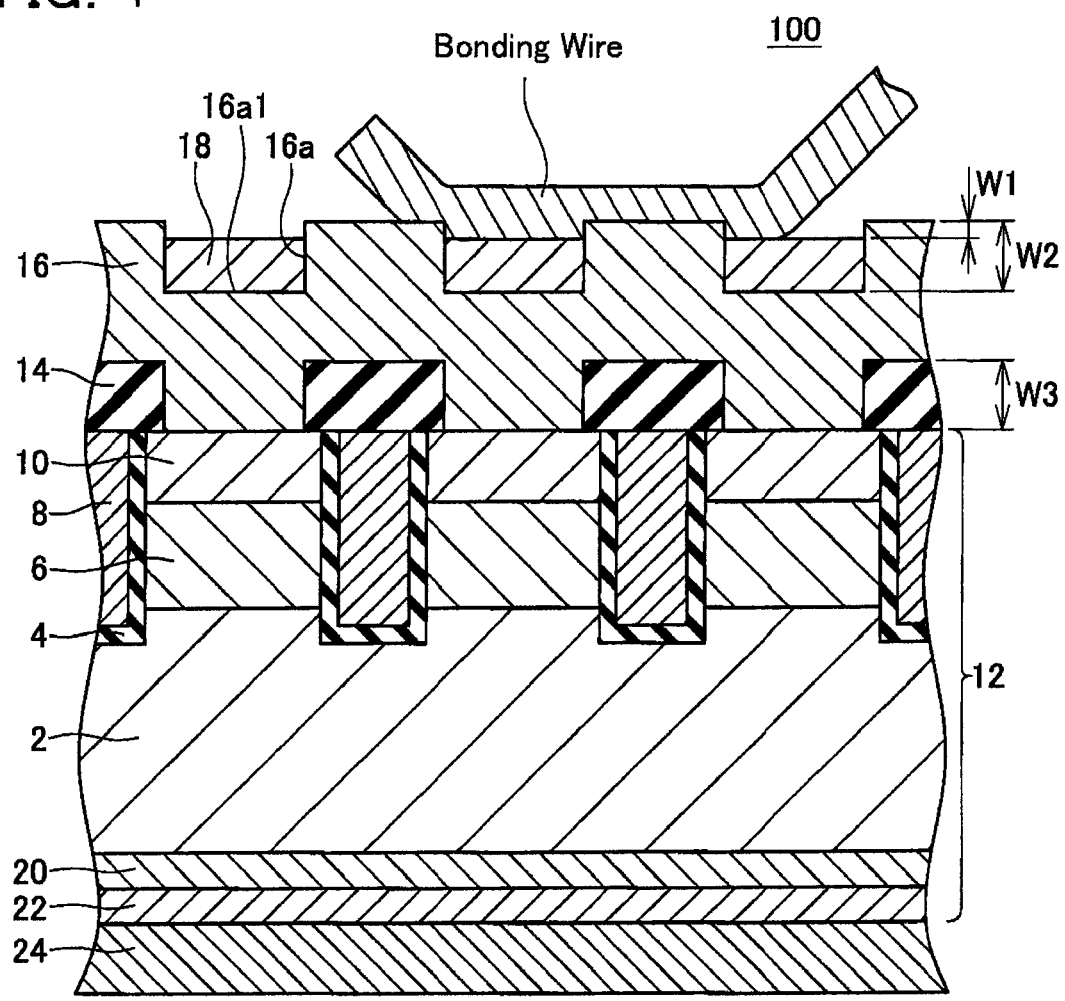
FIG. 1 shows a cross-sectional view of a semiconductor device 100 according to a first embodiment.

FIG. 1 shows a cross-sectional view of a part of a semiconductor device 100 according to a first embodiment. The semiconductor device 100 is a vertical IGBT (Insulated Gate Bipolar Transistor). The semiconductor device 100 comprises a semiconductor substrate 12, interlayer insulating films 14, an emitter electrode (an upper surface electrode) 16, stress relaxation portions 18, and a collector electrode 24. Trench gate electrodes 8, gate insulating films 4, contact regions 10, body regions 6, a drift region 2, a buffer region 20, and a collector region 22 are formed in the semiconductor substrate 12. The trench gate electrodes 8 penetrate the contact regions 10 and the body regions 6 from an upper surface of the semiconductor substrate 12 and extend until reaching the drift region 2. Wall surfaces of the trench gate electrodes 8 are covered by the gate insulating films 4. The contact regions 10 are $n^+$ type regions which are formed in areas exposing at the upper surface of the semiconductor substrate 12 and which are electrically connected to the emitter electrode 16. $P^+$ type body contact regions (not shown) are formed at parts of the contact regions 10 and stabilize a potential of the body regions 6 with a potential of the emitter electrode 16. The drift region 2 is an $n^-$ type region and is electrically connected to the collector electrode 24 via the buffer region 20 and the collector region 22. The body regions 6 are $p^-$ type regions and separate the contact regions 10 and the drift region 2 from each other. The buffer region 20 is an $n^+$ type region and separates the collector region 22 and the drift region 2 from each other. The collector region 22 is a $p^+$ type region and reduces a contact resistance with the collector electrode 24.

In the semiconductor device 100, the interlayer insulating films 14 are provided on the upper surface of the semiconductor substrate 12 between the contact regions 10 (on upper surfaces of the trench gate electrodes 8). The emitter electrode 16 is provided across all upper surfaces of the contact regions 10 and all upper surfaces of the interlayer insulating films 14. Due to an influence of a thickness W3 of the interlayer insulating films 14, steps 16a are formed on an upper surface of the emitter electrode 16. A height W2 of the step 16a is approximately equal to the thickness W3 of the interlayer insulating films 14. The stress relaxation portions 18 are provided on parts of the upper surface of the emitter electrode 16 above the contact regions 10 (low part 16a1 of the step 16a). The emitter electrode 16 is formed of, for example, aluminum. The stress relaxation portions 18 are formed of a conductive material (for example, polyaniline). A Young's modulus of the material of the stress relaxation portions 18 is lower than a Young's modulus of the material of the emitter electrode 16. In the semiconductor device 100, when a predetermined voltage is applied to the trench gate electrodes 8, a channel is formed in the body regions 6 between the contact regions 10 and the drift region 2 and a current flows between the emitter electrode 16 and the collector electrode 24.

Table 1 shows combinations of the material of the emitter electrode 16 and the material of the stress relaxation portions 18. The emitter electrode 16 and the stress relaxation portions 18 can be formed using the combinations shown in Table 1.

TABLE 1

| emitter electrode | | stress relaxation portions | |
|---|---|---|---|
| material | Young's modulus of the material ($\times 10^{10}$ Pa) | material | Young's modulus of the material ($\times 10^{10}$ Pa) |
| Titanium | 11.57 | Polyaniline | 4.00 |
| Aluminum | 7.03 | Polyaniline | 4.00 |
| Gold | 7.80 | Polyaniline | 4.00 |
| Silver | 8.27 | Polyaniline | 4.00 |
| Copper | 12.98 | Polyaniline | 4.00 |
| Copper | 12.98 | Silver | 8.27 |

A method of forming the emitter electrode 16 and the stress relaxation portions 18 on the upper surface of the semiconductor substrate 12 will now be described. First, the emitter electrode 16 is formed on the upper surface of the semiconductor substrate 12 on which the interlayer insulating films 14 are provided. At this point, a step is formed on a upper surface of the emitter electrode 16 according to the thickness of the interlayer insulating film 14. In other words, a low step is formed above the contact regions 10. Next, the stress relaxation portions 18 are formed so as to fill the step on the upper surface of the emitter electrode 16 above the contact regions 10 (the low parts of the step). Accordingly, the emitter electrode 16 with the stress relaxation portions 18 provided on the upper surface thereof can be formed on the upper surface of the semiconductor substrate 12. Moreover, while an uppermost surface is preferably smooth from a perspective of reliability of wire bonding, with the semiconductor device 100, a small step W1 is created on the uppermost surface due to production tolerance. In every semiconductor device according to second to eighth embodiments described later, small step is created on the uppermost surface due to the production tolerance.

With the semiconductor device 100, since the stress relaxation portions 18 are softer than the emitter electrode 16, when the external wiring is wire-bonded, the stress applied during the wire bonding is relaxed by the stress relaxation portions 18. Since the stress transferred to the contact regions 10 during the wire bonding is relaxed, the damage to the contact regions 10 during the wire bonding can be suppressed. In addition, by having the stress relaxation portions 18 provided above the contact regions 10, the step formed on the uppermost surface of the semiconductor device 100 is reduced down to a height W1 (<W3). As a result, the reliability of the wire bonding can be improved. Furthermore, when forming the stress relaxation portions 18 with polyaniline, by bringing the polyaniline into contact with the emitter electrode 16, corrosion of the emitter electrode 16 can be prevented. Moreover, while the step W1 that is higher on the upper surface of the emitter electrode 16 and lower on the upper surfaces of the stress relaxation portions 18 is formed on the uppermost surface of the semiconductor device 100, a step may be formed that is lower on the upper surface of the emitter electrode 16 and higher on the upper surfaces of the stress relaxation portions 18. Alternatively, the upper surface of the emitter electrode 16 and the upper surfaces of the stress relaxation portions 18 may share a same surface and the uppermost surface may be smooth.

Second Embodiment

Figure 2:
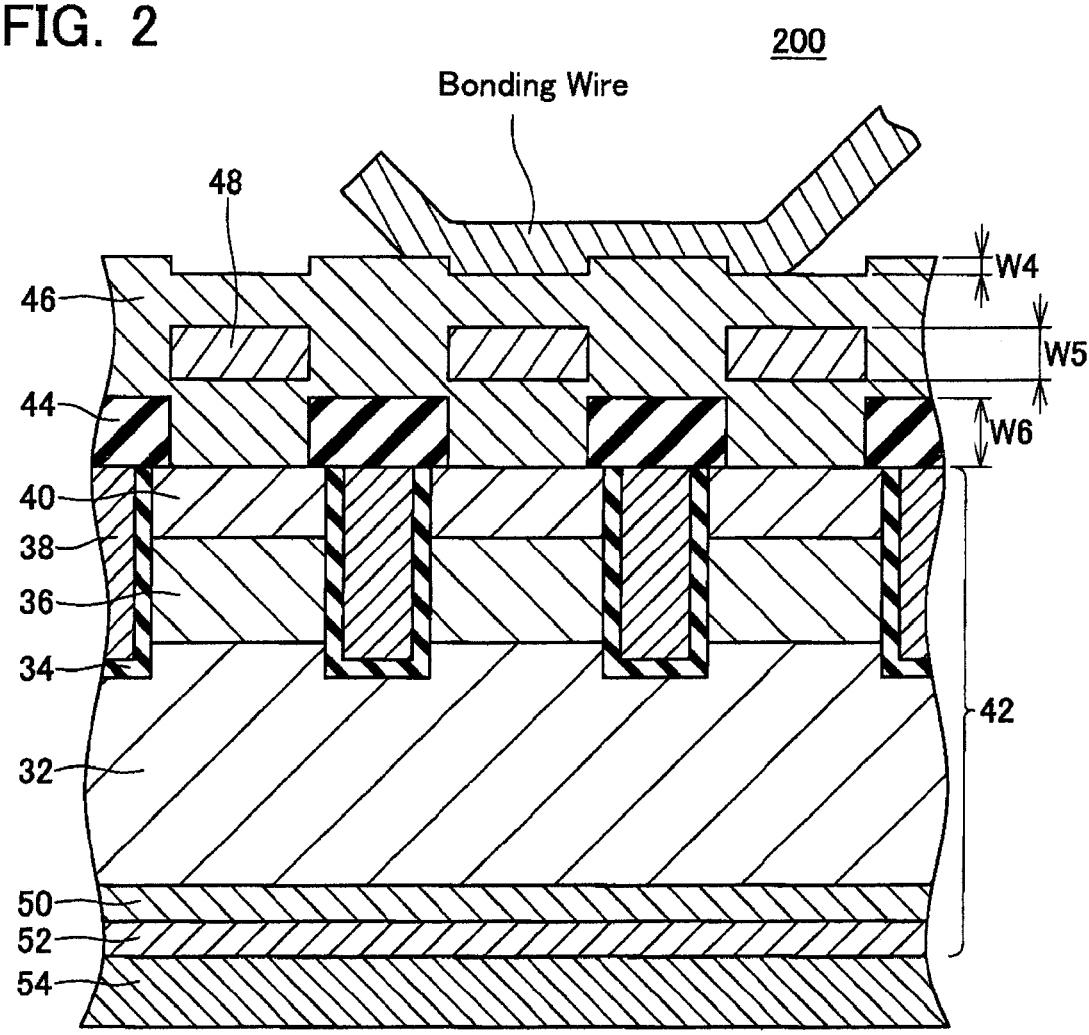
FIG. 2 shows a cross-sectional view of a semiconductor device 200 according to a second embodiment.

FIG. 2 shows a cross-sectional view of a semiconductor device 200 according to a second embodiment. In FIG. 2, members having 30 added to corresponding reference signs in FIG. 1 denote the same members as described with reference to FIG. 1. With the semiconductor device 200, stress relaxation portions 48 are provided above contact regions 40 and inside an emitter electrode 46.

A method of forming the emitter electrode 46 and the stress relaxation portions 48 on an upper surface of a semiconductor substrate 42 will now be described. First, the emitter electrode 46 is formed up to half a predetermined height on the upper surface of the semiconductor substrate 42 on which interlayer insulating films 44 are provided. At this point, a step is formed on an upper surface of the emitter electrode 46 according to a thickness of the interlayer insulating film 44. That is, low steps are formed above the contact regions 40. Next, the stress relaxation portions 48 are formed so as to fill the step on the upper surface of the emitter electrode 46 above the contact regions 40 (the low parts of the steps) to reduce the steps. Subsequently, the emitter electrode 46 is further formed up to the predetermined height on the upper surface of the emitter electrode 46 and surfaces of the stress relaxation portions 48. Accordingly, the emitter electrode 46 with the stress relaxation portions 48 provided therein can be formed on the upper surface of the semiconductor substrate 42.

With the semiconductor device 200, an influence of a thickness W6 of the interlayer insulating film 44 is cancelled according to a thickness W5 of the stress relaxation portions 48, and a height of a step formed on an uppermost surface of the semiconductor device 200 is reduced to a height W4 (<W6). Here, W6>W5>W4. Therefore, even when the stress relaxation portions 48 are provided inside the emitter electrode 46, the stress applied during the wire bonding can be relaxed and the reliability of the wire bonding can be enhanced. In addition, with the semiconductor device 200, since the emitter electrode 46 is provided on an entire uppermost surface of the semiconductor device 200, a layer on which the external wiring is to be bonded can be formed of a same material and favorable bonding performance can be achieved.

Third Embodiment

Figure 3:
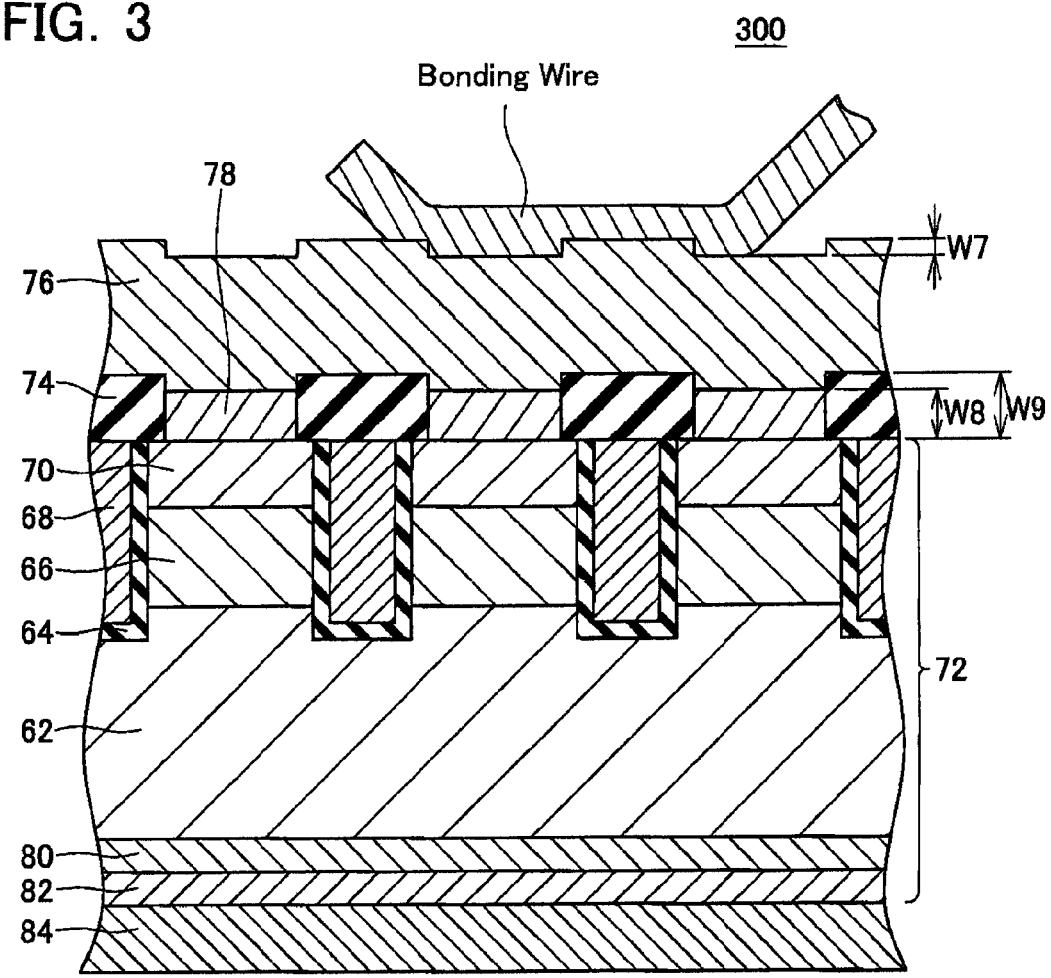
FIG. 3 shows a cross-sectional view of a semiconductor device 300 according to a third embodiment.

FIG. 3 shows a cross-sectional view of a semiconductor device 300 according to a third embodiment. In FIG. 3, members having 60 added to corresponding reference signs in FIG. 1 denote the same members as described with reference to FIG. 1. With the semiconductor device 300, stress relaxation portions 78 are provided above contact regions 70 and on a lower surface of an emitter electrode 76. In addition, the stress relaxation portions 78 are brought into contact with the contact regions 70 and provided consecutively between adjacent interlayer insulating films 74.

A method of forming the emitter electrode 76 and the stress relaxation portions 78 on an upper surface of a semiconductor substrate 72 will now be described. First, the stress relaxation portions 78 are formed between the interlayer insulating films 74 on the upper surface of the semiconductor substrate 72 on which the interlayer insulating films 74 are provided. Accordingly, a step due to a thickness of the interlayer insulating films 74 is reduced. Next, the emitter electrode 76 is formed on upper surfaces of the interlayer insulating films 74 and on upper surfaces of the stress relaxation portions 78. Accordingly, the emitter electrode 76 with the stress relaxation portions 78 provided on a lower surface thereof can be formed on the upper surface of the semiconductor substrate 72.

With the semiconductor device 300, an influence of a thickness W9 of the interlayer insulating films 74 is cancelled according to a thickness W8 of the stress relaxation portions 78, and a height of a step formed on an uppermost surface of the semiconductor device 300 is reduced to a height W7 (<W9). Here, W9>W8>W7. Therefore, even when the stress relaxation portions 78 are provided on the lower surface of the emitter electrode 76, stress applied during the wire bonding can be relaxed and a step formed on an uppermost surface of the semiconductor device 300 can be reduced. As a result, the reliability of the wire bonding can be enhanced. In addition, with the semiconductor device 300, since the stress relaxation portions 78 are in contact with edges of the interlayer insulating films 74 where the stress tends to concentrate, the stress is effectively relaxed by the stress relaxation portions 78. Consequently, a stress relaxing effect can be enhanced.

Fourth Embodiment

Figure 4:
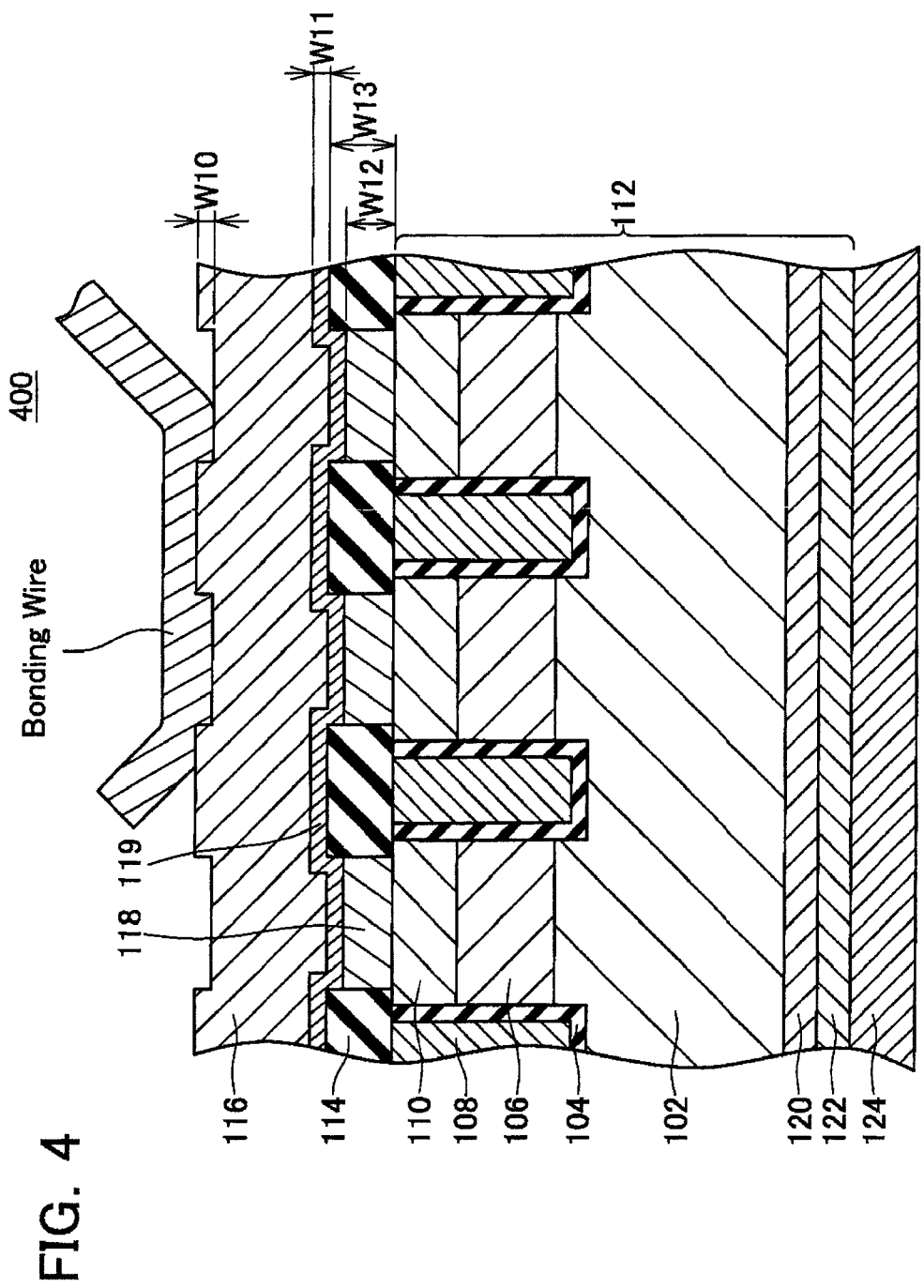
FIG. 4 shows a cross-sectional view of a semiconductor device 400 according to fourth embodiment.

FIG. 4 shows a cross-sectional view of a semiconductor device 400 according to a fourth embodiment. In FIG. 4, members having 100 added to corresponding reference signs in FIG. 1 denote the same members as described with reference to FIG. 1. With the semiconductor device 400, stress relaxation portions 118 are brought into contact with contact regions 110 and are provided consecutively between adjacent interlayer insulating films 114. In addition, a conductive portion 119 that separates the stress relaxation portions 118 and an emitter electrode 116 is provided between the stress relaxation portions 118 and the emitter electrode 116. Different materials are used for the stress relaxation portions 118 and the emitter electrode 116. The conductive portion 119 has a thickness of W11 and is continuously provided on upper surfaces of the interlayer insulating films 114 and the stress relaxation portions 118. A Young's modulus of a material of the conductive portion 119 is lower than a Young's modulus of a material of the emitter electrode 116 and higher than a Young's modulus of a material of the stress relaxation portions 118.

Table 2 shows combinations of the material of the emitter electrode 116, the material of the stress relaxation portions 118, and the material of the conductive portion 119. The material of the emitter electrode 116, the material of the stress relaxation portions 118, and the material of the conductive portion 119 can be formed using the combinations shown in Table 2.

TABLE 2

| emitter electrode Material | conductive portion Material | stress relaxation portions Material |
| --- | --- | --- |
| Copper | Aluminum | Polyaniline |
| Tungsten | Titanium | Polyaniline |

A method of forming the emitter electrode 116, the stress relaxation portions 118, and the conductive portion 119 on an upper surface of a semiconductor substrate 112 will now be described. First, the stress relaxation portions 118 are formed on the upper surface of the semiconductor substrate 112 by a procedure similar to the method of manufacturing the semiconductor device 300 according to the third embodiment. Next, the conductive portion 119 is formed on upper surfaces of the interlayer insulating films 114 and on upper surfaces of the stress relaxation portions 118. Subsequently, the emitter electrode 116 is formed on an upper surface of the conductive portion 119. Accordingly, the emitter electrode 116, the stress relaxation portions 118, and the conductive portion 119 can be formed on the upper surface of the semiconductor substrate 112.

With the semiconductor device 400, an influence of a thickness W13 of the interlayer insulating films 114 is cancelled according to a thickness W12 of the stress relaxation portions 118, and a height of a step formed on an uppermost surface of the semiconductor device 400 is reduced to a height W10 (<W12). Here, W13>W12>W11. As a result, the reliability during the wire bonding can be improved. Moreover, since the conductive portion 119 is continuously and uniformly formed on the upper surface of the emitter electrode 116 and the upper surfaces of the stress relaxation portions 118, the thickness W11 of the conductive portion 119 does not affect the height of the step formed on the uppermost surface. In addition, with the semiconductor device 400, by providing the conductive portion 119 between the emitter electrode 116 and the stress relaxation portions 118, stress applied during wire bonding can be relaxed in stages by the stress relaxation portions 118 and the conductive portion 119. Therefore, the stress applied during the wire bonding can be relaxed in a more effective manner.

Fifth Embodiment

Figure 5:
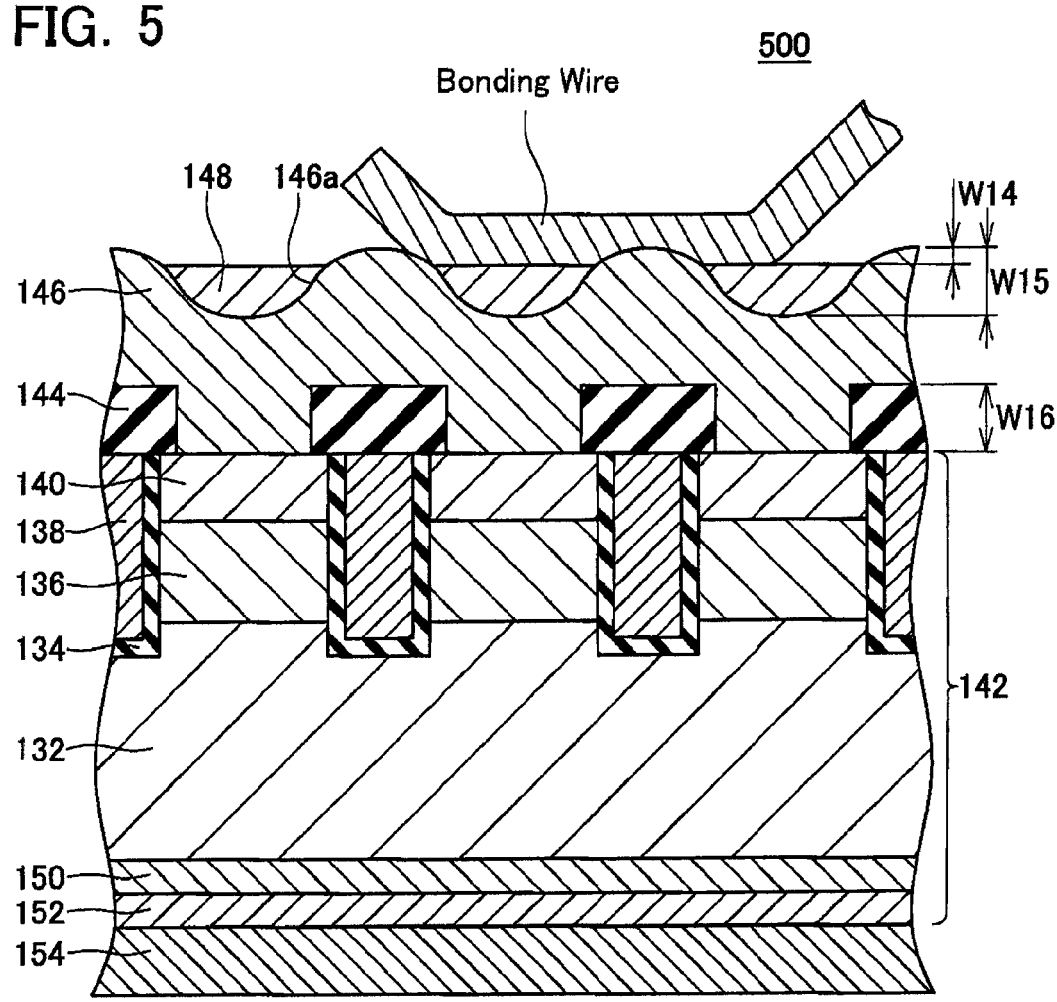
FIG. 5 shows a cross-sectional view of a semiconductor device 500 according to a fifth embodiment.

FIG. 5 shows a cross-sectional view of a semiconductor device 500 according to a fifth embodiment. In FIG. 5, members having 130 added to corresponding reference signs in FIG. 1 denote the same members as described with reference to FIG. 1. With the semiconductor device 500, due to an influence of a thickness W16 of interlayer insulating films 144, a smooth step 146a with a height of W15 is formed on an upper surface of an emitter electrode 146. Stress relaxation portions 148 are provided on parts of the upper surface of the emitter electrode 146 above contact regions 140 (low parts 146a1 of the steps 146a).

A method of forming the emitter electrode 146 and the stress relaxation portions 148 on an upper surface of a semiconductor substrate 142 will now be described. First, the emitter electrode 146 is formed on the upper surface of the semiconductor substrate 142 on which the interlayer insulating films 144 are provided. At this point, by raising a film forming temperature or an anneal temperature during formation of the emitter electrode 146, the emitter electrode 146 can be formed with a smooth upper surface configuration. Alternatively, by forming the emitter electrode 146 with increased thickness, the emitter electrode 146 can be formed with the smooth upper surface configuration. Next, the stress relaxation portions 148 are formed so as to fill the steps on the upper surface of the emitter electrode 146 above the contact regions 140 (the lower parts of the steps). Accordingly, the emitter electrode 146 with the stress relaxation portions 148 provided on the upper surface thereof can be formed on the surface of the semiconductor substrate 142.

With the semiconductor device 500, by having the stress relaxation portions 148 provided above the contact regions 140, a step formed on an uppermost surface of the semiconductor device 500 is reduced down to a height W14 (<W16). Here, W16>W15>W14. Therefore, even when the smooth step is formed on the upper surface of the emitter electrode 146, the stress applied during the wire bonding can be relaxed and the reliability of the wire bonding can be enhanced. In addition, with the semiconductor device 500, since the step on the uppermost surface has a smooth configuration, an area of the surface of the stress relaxation portion 148 is increased compared to a case where the step on the uppermost surface has an irregular configuration. Therefore, the stress applied during the wire bonding can be better relaxed than a case where the step on the uppermost surface has an irregular configuration. Consequently, the stress relaxing effect can be enhanced.

Sixth Embodiment

Figure 6:
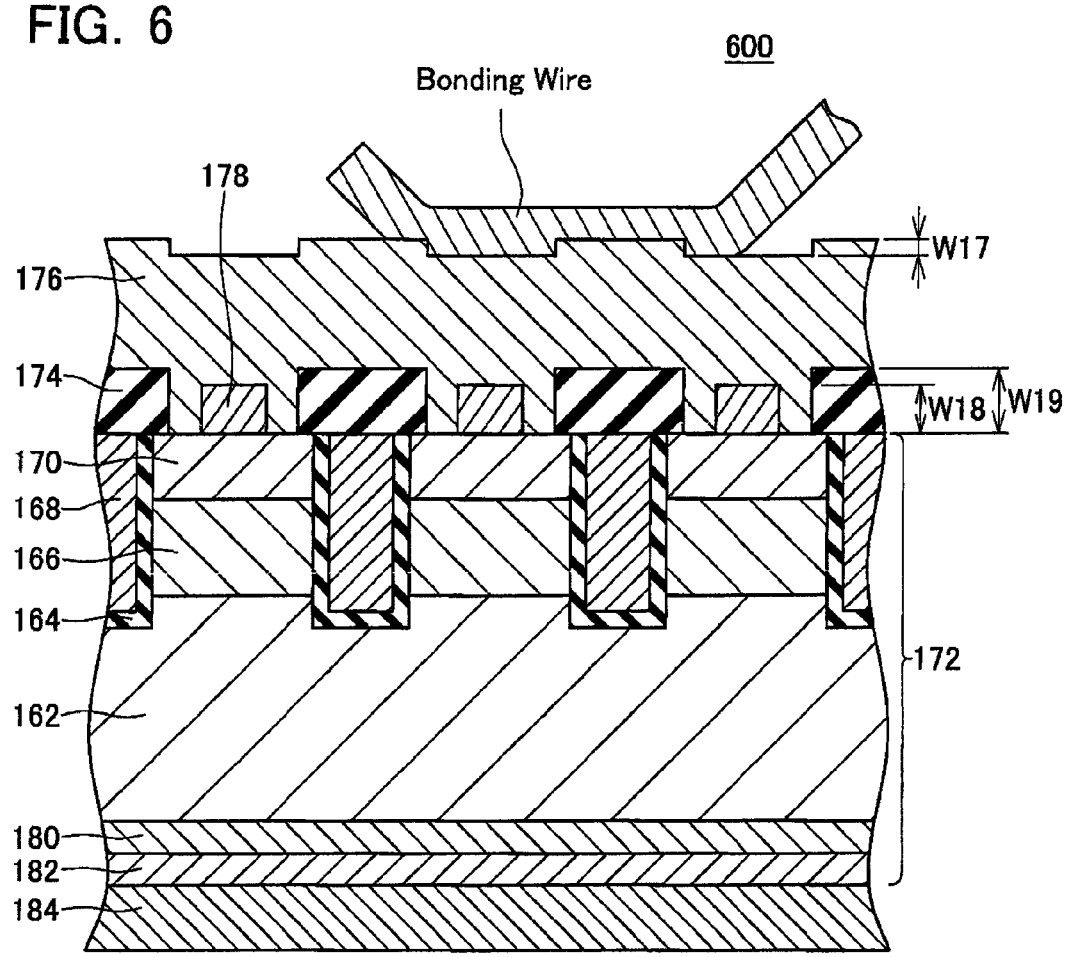
FIG. 6 shows a cross-sectional view of a semiconductor device 600 according to a sixth embodiment.

FIG. 6 shows a cross-sectional view of a semiconductor device 600 according to a sixth embodiment. In FIG. 6, members having 160 added to corresponding reference signs in FIG. 1 denote the same members as described with reference to FIG. 1. With the semiconductor device 600, stress relaxation portions 178 are provided on a lower surface of an emitter electrode 176 in parts of regions above contact regions 170. The stress relaxation portions 178 are provided in parts of regions between adjacent interlayer insulating films 174. In addition, the stress relaxation portions 178 are in contact with the contact regions 170 but not with the interlayer insulating films 174. The stress relaxation portions 178 of the semiconductor device 600 can be formed by arranging the stress relaxation portions 178 only in parts of regions above contact regions 170 using the method of forming the stress relaxation portions 78 of the semiconductor device 300 according to the third embodiment. The emitter electrode 176 of the semiconductor device 600 can be formed according to the method of forming the emitter electrode 76 of the semiconductor device 300 according to the third embodiment.

With the semiconductor device 600, an influence of a thickness W19 of the interlayer insulating films 174 is cancelled according to a thickness W18 of the stress relaxation portions 178, and a height of a step formed on an uppermost surface of the semiconductor device 600 is reduced to a height W17 (<W19). Here, W19>W18>W17. Therefore, even when the stress relaxation portions 178 are provided in parts of regions above the contact regions 170, the stress applied during the wire bonding can be relaxed and the height of the step formed on the uppermost surface of the semiconductor device 600 can be reduced. As a result, the reliability during the wire bonding can be enhanced. In addition, with the semiconductor device 600, since a carrier passes through a vicinity of the interlayer insulating films 174, the carrier flows into a drift region 162 without having to pass through the stress relaxation portions 178. As a result, the carrier is not subjected to resistance due to the stress relaxation portions 178 and favorable on-resistance can be achieved.

Seventh Embodiment

Figure 7:
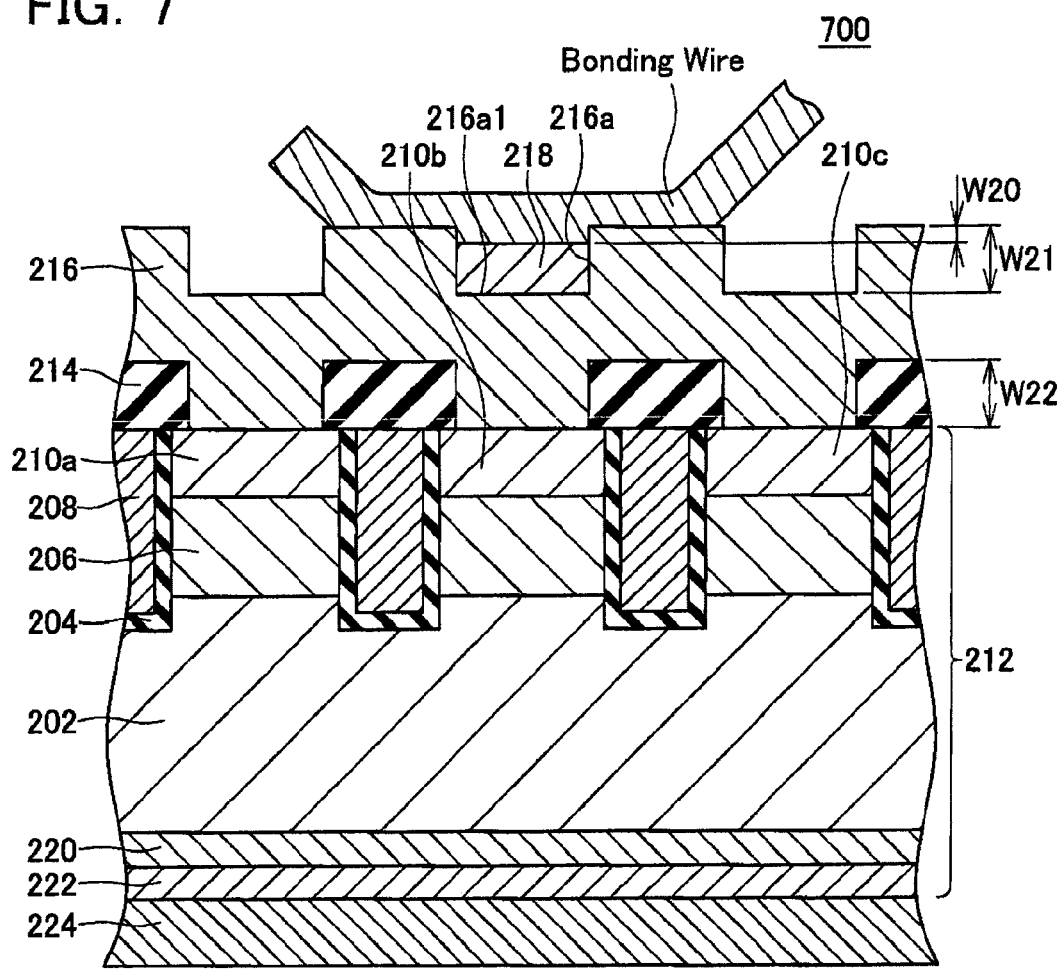
FIG. 7 shows a cross-sectional view of a semiconductor device 700 according to a seventh embodiment.

FIG. 7 shows a cross-sectional view of a semiconductor device 700 according to a seventh embodiment. In FIG. 7, members having 200 added to corresponding reference signs in FIG. 1 denote the same members as described with reference to FIG. 1. With the semiconductor device 700, due to an influence of a thickness W22 of interlayer insulating films 214, a step 216a having a height of W21 is formed on an upper surface of an emitter electrode 216. The height W21 of the step 216a is approximately equal to the thickness W22 of the interlayer insulating films 214. Stress relaxation portion 218 is only provided on the upper surface of the emitter electrode 216 above contact region 210b (low part 216a1 of the step 216a). The stress relaxation portion 218 is not provided above other contact regions 210a and 210c. The emitter electrode 216 of the semiconductor device 700 can be formed according to the method of forming the emitter electrode 16 of the semiconductor device 100 according to the first embodiment. The stress relaxation portion 218 of the semiconductor device 700 can be formed by arranging the stress relaxation portion 218 only above the contact regions 210b using the method of forming the stress relaxation portions 18 of the semiconductor device 100 according to the first embodiment.

With the semiconductor device 700, by having the stress relaxation portion 218 provided only above a part of the contact regions 210b, a part of a step formed on an uppermost surface of the semiconductor device 700 is reduced down to a height W20 (<W22). With the semiconductor device 700, even when the stress relaxation portion 218 is provided above part of the contact regions 210b, the reliability of the wire bonding can be enhanced. Moreover, when providing the stress relaxation portion 218 only above the contact regions 210b, the stress relaxation portion 218 is preferably provided directly underneath where the wire bonding is to be preformed. In this case, the stress applied during the wire bonding can be relaxed in an effective manner.

Eighth Embodiment

Figure 8:
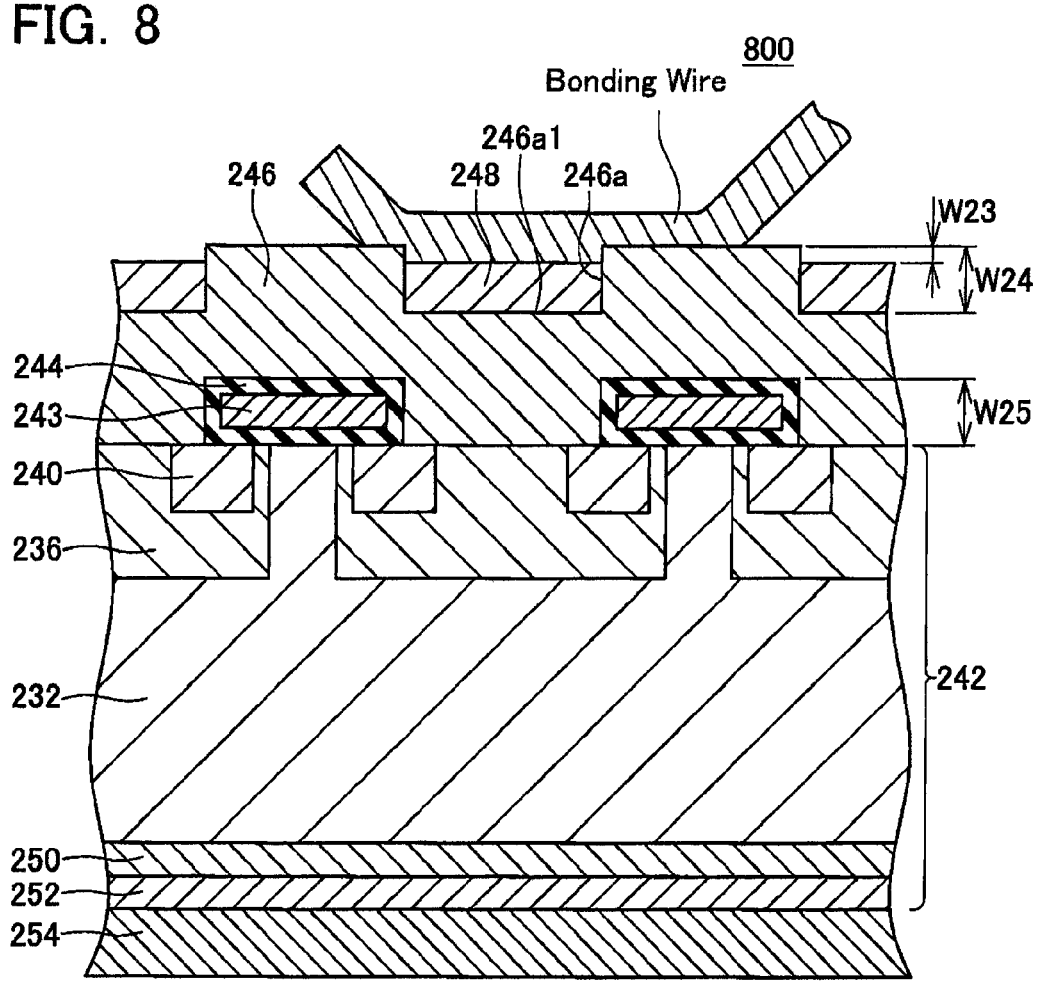
FIG. 8 shows a cross-sectional view of a semiconductor device 800 according to an eighth embodiment.

FIG. 8 shows a cross-sectional view of a semiconductor device 800 according to an eighth embodiment. The semiconductor device 800 is a planar gate IGBT. The semiconductor device 800 comprises a semiconductor substrate 242, planar gate electrodes 243, an emitter electrode 246, stress relaxation portions 248, and a collector electrode 254. Contact regions 240, body regions 236, a drift region 232, a buffer region 250, and a collector region 252 are formed in the semiconductor substrate 242. The contact regions 240 are $n^+$ type regions which are formed in areas exposing at an upper surface of the semiconductor substrate 242 and which are electrically connected to the emitter electrode 246. $P^+$ type body contact regions (not shown) are formed at parts of the contact regions 240 and stabilize a potential of the body regions 236 with a potential of the emitter electrode 246. The drift region 232 is an $n^-$ type region which is formed in an area exposing at a lower surface of the semiconductor substrate 242 and which is electrically connected to the collector electrode 254 via the buffer region 250 and the collector region 252. The body regions 236 are $p^-$ type regions and separate the contact regions 240 and the drift region 232 from each other. The buffer region 250 is an $n^+$ type region and separates the collector region 252 and the drift region 232 from each other. The collector region 252 is a $p^+$ type region and reduces a contact resistance with the collector electrode 254.

With the semiconductor device 800, the planar gate electrodes 243 are provided at parts of the upper surface of the semiconductor substrate 242 and oppose a part of the contact regions 240 via gate insulating films 244. In addition, the planar gate electrodes 243 are provided between adjacent contact regions 240 via an upper surface of a part of the drift region 232 and upper surfaces of parts of the body regions 236. Wall surfaces of the planar gate electrodes 243 are covered by the gate insulating films 244. Due to an influence of a thickness W25 of the planar gate electrodes 243 covered by the gate insulating films 244, a step 246a is formed on an upper surface of the emitter electrode 246. A height W24 of the step 246a is approximately equal to a thickness W25 of the planar gate electrodes 243 covered by the gate insulating films 244. The stress relaxation portions 248 are provided on a part of the upper surface of the emitter electrode 246 above regions between adjacent planar gate electrodes 243 (low parts 246a1 of the step 246a). The emitter electrode 246 is formed of, for example, aluminum. The stress relaxation portions 248 are formed of a conductive material (for example, polyaniline). A Young's modulus of the material of the stress relaxation portions 248 is lower than a Young's modulus of the material of the emitter electrode 246. In the semiconductor device 800, when a predetermined voltage is applied to the planar gate electrodes 243, a channel is formed in the body regions 236 between the contact regions 240 and the drift region 232 and a current flows between the emitter electrode 246 and the collector electrode 254.

Figure 9:
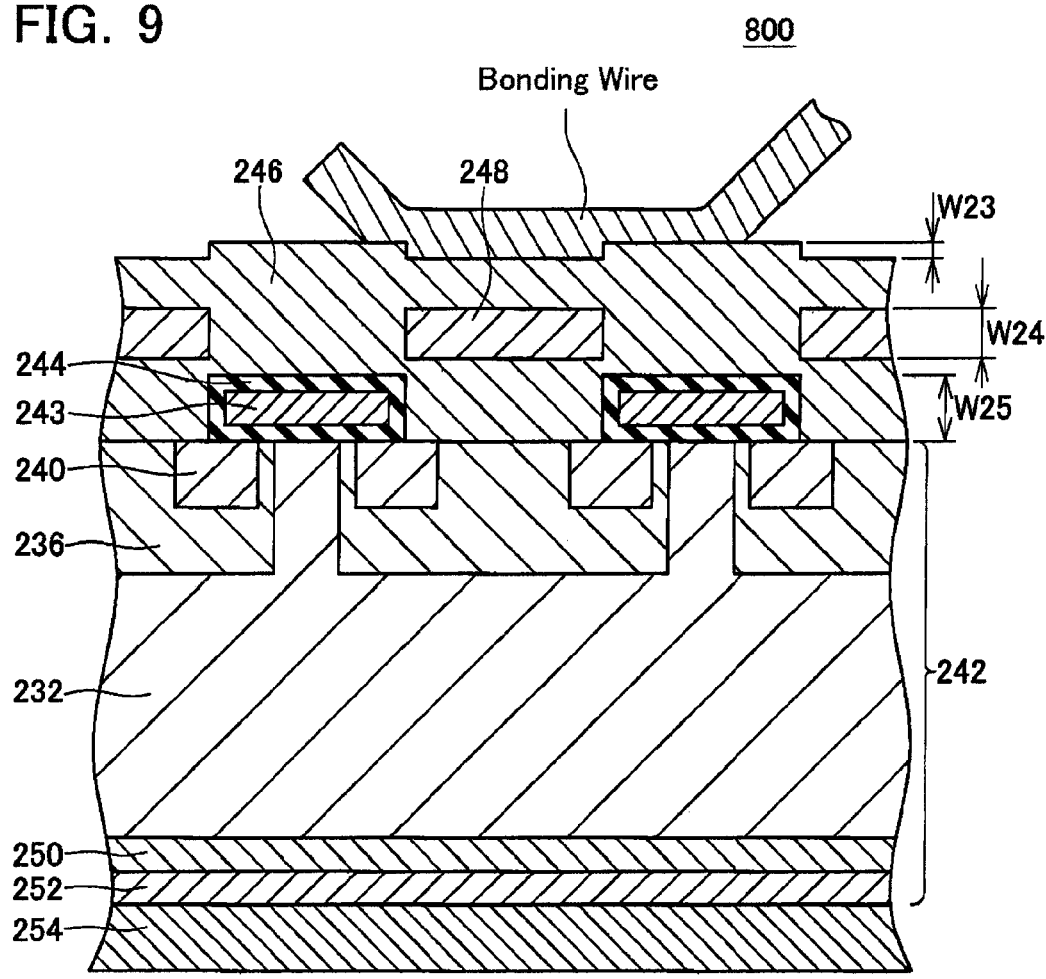
FIG. 9 shows a cross-sectional view of another structure of the semiconductor device 800 according to the eighth embodiment.
Figure 10:
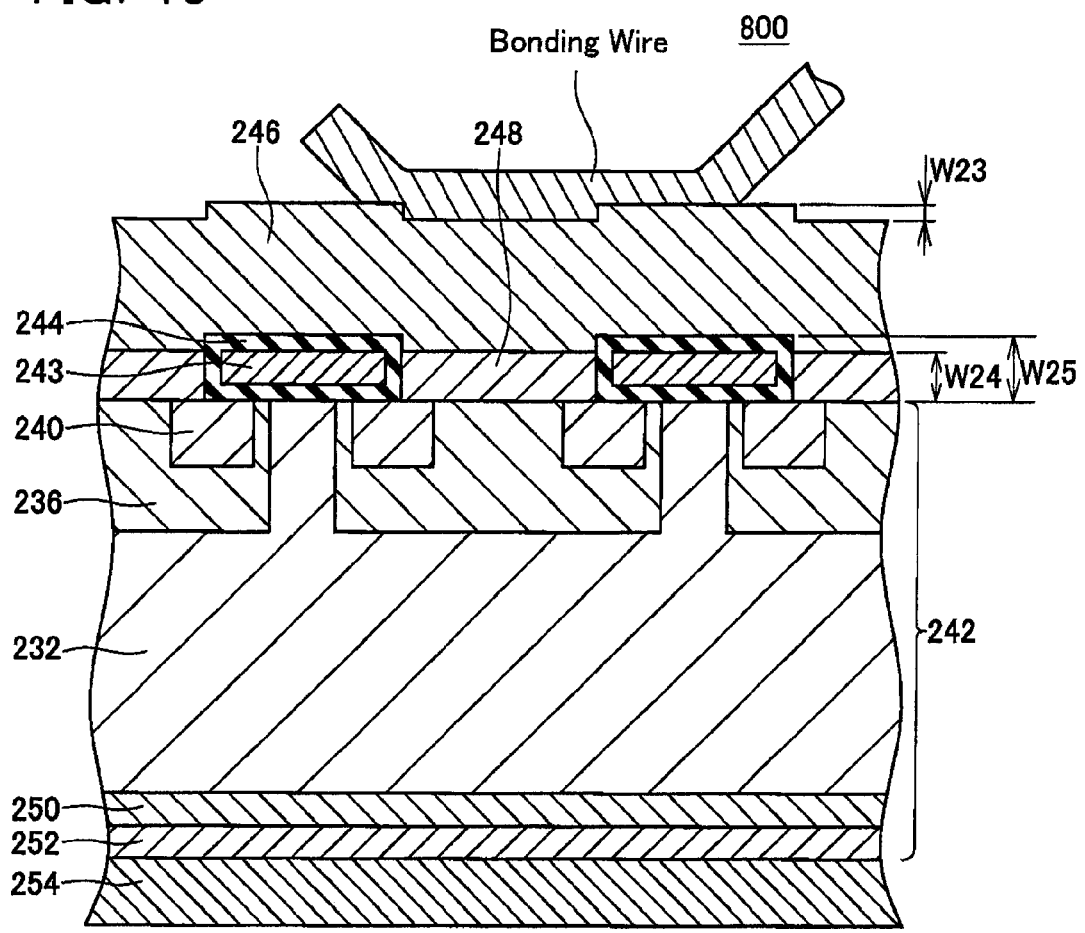
FIG. 10 shows a cross-sectional view of yet another structure of the semiconductor device 800 according to the eighth embodiment.

The emitter electrode 246 and the stress relaxation portions 248 of the semiconductor device 800 shown in FIG. 8 can be formed on the upper surface of the semiconductor substrate 242 on which planar gate electrodes 243 are formed according to the method of forming the emitter electrode 16 and the stress relaxation portions 18 of the semiconductor device 100 according to the first embodiment. Moreover, the stress relaxation portions 248 may be provided inside the emitter electrode 246 as shown in FIG. 9 or on a lower surface of the emitter electrode 246 as shown in FIG. 10. In a case of a structure shown in FIG. 9, the emitter electrode 246 and the stress relaxation portions 248 can be formed on the upper surface of the semiconductor substrate 242 on which planar gate electrodes 243 are provided according to the method of forming the emitter electrode 46 and the stress relaxation portions 48 of the semiconductor device 200 according to the second embodiment. In a case of a structure shown in FIG. 10, the emitter electrode 246 and the stress relaxation portions 248 can be formed on the upper surface of the semiconductor substrate on which planar gate electrodes 243 are provided according to the method of forming the emitter electrode 76 and the stress relaxation portions 78 of the semiconductor device 300 according to the third embodiment.

With the semiconductor device 800, since the stress relaxation portions 248 are softer than the emitter electrode 246, when the external wiring is wire-bonded, the stress applied during the wire bonding is relaxed by the stress relaxation portion 248. Since the stress transferred to the contact regions 240 during the wire bonding is relaxed, the damage to the contact regions 240 during the wire bonding can be suppressed. In addition, by having the stress relaxation portions 248 provided above regions between adjacent planar gate electrodes 243, a step formed on an uppermost surface of the semiconductor device 800 is reduced down to a height W23 (<W25). Here, W25>W24>W23. As a result, reliability of the wire bonding can be improved.

Although the above has provided a detailed explanation of examples of the present invention, these are merely examples and are not intended to limit the scope of the claims. Various modifications and alterations of the specific examples listed above are included in the technology described in the claims.

The technical elements explained in the present description or drawings demonstrate technical usefulness either alone or by combining various types thereof, and are not limited to the combinations described in the claims at the time of filing. In addition, technologies exemplified in the present description or drawings are able to achieve multiple objects simultaneously, and the achieving of one of those objects per se has technical usefulness.

REFERENCE SIGNS LIST 2, 32, 62, 102, 132, 162, 202, 232: drift region
4, 34, 64, 104, 134, 164, 204, 244: gate insulating film
6, 36, 66, 106, 136, 166, 206, 236: body region
8, 38, 68, 108, 138, 168, 208: trench gate electrode
10, 40, 70, 110, 140, 170, 210a, 210b, 210c, 240: contact region
12, 42, 72, 112, 142, 172, 212, 242: semiconductor substrate
14, 44, 74, 114, 144, 174, 214: interlayer insulating film
16, 46, 76, 116, 146, 176, 216, 246: emitter electrode
18, 48, 78, 118, 148, 178, 218, 248: stress relaxation portion
20, 50, 80, 120, 150, 180, 220, 250: buffer region
22, 52, 82, 122, 152, 182, 222, 252: collector region
24, 54, 84, 124, 154, 184, 224, 254: collector electrode
119: conductive portion
243: planar gate electrode

The invention claimed is:

1. A semiconductor device comprising:
a plurality of contact regions formed in areas exposing at a surface of a semiconductor substrate at a certain interval;
an insulating film provided on the surface of the semiconductor substrate between adjacent contact regions;
a surface electrode provided on an upper side of the semiconductor substrate and electrically connected to each of the contact regions;
a stress relaxation portion provided on at least one part of an upper surface or an inside of the surface electrode in an area above the contact regions and the stress relaxation portion does not overlap with the insulating film; and
a bonding wire bonded on both of the surface electrode and the stress relaxation portion or both of the surface electrode above the stress relaxation portion and the surface electrode above the insulating film,
wherein the stress relaxation portion is formed of a first conductive material, and
the Young's modulus of the first conductive material of the stress relaxation portion when stress is applied in a direction perpendicular to the upper surface of the surface electrode is lower than the Young's modulus of a material of the surface electrode when stress is applied in the direction perpendicular to the upper surface of the surface electrode.

2. The semiconductor device according to claim 1, wherein the surface electrode includes titanium, aluminum, gold, silver, copper, or tungsten and
the bonding wire includes the same material as the surface electrode.

3. The semiconductor device according to claim 1 wherein the first conductive material includes polyaniline.

4. A semiconductor device comprising:
a plurality of contact regions formed in areas exposing at a surface of a semiconductor substrate at a certain interval;
an insulating film provided on the surface of the semiconductor substrate between adjacent contact regions;
a surface electrode provided on an upper side of the semiconductor substrate and electrically connected to each of the contact regions;
a stress relaxation portion provided on a lower surface of the surface electrode in an area above the contact regions and the stress relaxation portion does not overlap with the insulating film, wherein the stress relaxation portion is formed of a first conductive material,
a conductive portion formed of a second conductive material and between the surface electrode and the stress relaxation portion, and
a bonding wire bonded both of the surface electrode above the stress relaxation portion and the surface electrode above the insulating film;
wherein the Young's modulus of the first conductive material of the stress relaxation portion when stress is applied in a direction perpendicular to the upper surface of the surface electrode is lower than the Young's modulus of a material of the surface electrode when stress is applied in the direction perpendicular to the upper surface of the surface electrode; and wherein the Young's modulus of the second conductive material when stress is applied in the direction perpendicular to the upper surface of the surface electrode is lower than the Young's modulus of the surface electrode and higher than the Young's modulus of the first conductive material when stress is applied in the direction perpendicular to the upper surface of the surface electrode.

5. The semiconductor device according to claim 4, wherein the surface electrode includes titanium, aluminum, gold, silver, copper, or tungsten and the bonding wire includes the same material as the surface electrode.

6. The semiconductor device according to claim 4 wherein the first conductive material includes polyaniline.

7. A semiconductor device comprising:

a plurality of contact regions formed in areas exposing at a surface of a semiconductor substrate at a certain interval;

a drift region formed in an area exposing at the surface of the semiconductor substrate between adjacent contact regions;

planar gate electrodes provided on an upper side of the semiconductor substrate;

a surface electrode provided on the upper side of the semiconductor substrate and electrically connected to a part of the contact regions;

a stress relaxation portion provided on at least one part of an upper surface or an inside of the surface electrode in an area above a region between adjacent planar gate electrodes and in which the stress relaxation portion does not overlap with the planar gate electrodes; and a bonding wire bonded on both of the surface electrode and the stress relaxation portion or both of the surface electrode above the stress relaxation portion and the surface electrode above the insulating film, wherein the stress relaxation portion is formed of a first conductive material, and the Young's modulus of the first conductive material when stress is applied in a direction perpendicular to the upper surface of the surface electrode is lower than the Young's modulus of a material of the surface electrode when stress is applied in the direction perpendicular to the upper surface of the surface electrode.

8. The semiconductor device according to claim 7, wherein the surface electrode includes titanium, aluminum, gold, silver, copper, or tungsten and the bonding wire includes the same material as the surface electrode.

9. The semiconductor device according to claim 7, wherein the first conductive material includes polyaniline.

* * * * *